US007117456B2

(12) United States Patent
Gray et al.

(10) Patent No.: US 7,117,456 B2
(45) Date of Patent: Oct. 3, 2006

(54) CIRCUIT AREA MINIMIZATION USING SCALING

(75) Inventors: Michael S. Gray, Fairfax, VT (US); Kevin W. McCullen, Essex Junction, VT (US); Gustavo E. Tellez, Essex Junction, VT (US); Robert F. Walker, St. George, VT (US)

(73) Assignee: International Business Machines Corporation, Armonk, NY (US)

( * ) Notice: Subject to any disclaimer, the term of this patent is extended or adjusted under 35 U.S.C. 154(b) by 386 days.

(21) Appl. No.: 10/707,287

(22) Filed: Dec. 3, 2003

(65) Prior Publication Data

US 2005/0125748 A1 Jun. 9, 2005

(51) Int. Cl.
*G06F 17/50* (2006.01)
*G06F 9/45* (2006.01)

(52) U.S. Cl. .................... 716/2; 716/7; 716/8
(58) Field of Classification Search ............ 716/2, 716/7, 8
See application file for complete search history.

(56) References Cited

U.S. PATENT DOCUMENTS

| 5,231,590 | A |   | 7/1993  | Kumar et al.      |        |
|-----------|---|---|---------|-------------------|--------|
| 5,406,497 | A | * | 4/1995  | Altheimer et al.  | 716/6  |
| 5,416,722 | A |   | 5/1995  | Edwards           |        |
| 5,477,467 | A |   | 12/1995 | Rugg              |        |
| 5,598,344 | A |   | 1/1997  | Dangelo et al.    |        |
| 5,619,419 | A |   | 4/1997  | D'Haeseleer et al.|        |
| 5,625,568 | A |   | 4/1997  | Edwards et al.    |        |
| 5,636,132 | A |   | 6/1997  | Kamdar            |        |
| 5,663,892 | A |   | 9/1997  | Hayashi et al.    |        |
| 5,689,433 | A |   | 11/1997 | Edwards           |        |
| 5,889,681 | A |   | 3/1999  | Suda              |        |
| 5,936,868 | A |   | 8/1999  | Hall              |        |
| 5,974,244 | A |   | 10/1999 | Hayashi et al.    |        |

(Continued)

FOREIGN PATENT DOCUMENTS

JP     2001339312 A     12/2001

OTHER PUBLICATIONS

Heng, F, et al., "A VLSI Artwork Legalization Technique Based on a New Criterion of Minimum Layout Perturbation", Proceedings of the 1997 International Symposium on Physical Design, pp. 116-121.*

(Continued)

*Primary Examiner*—Stacy A. Whitmore
*Assistant Examiner*—Magid Y. Dimyan
(74) *Attorney, Agent, or Firm*—Richard M. Kotulak; Hoffman, Warnick & D'Alessandro LLC

(57) ABSTRACT

A method, system and program product that implements area minimization of a circuit design while respecting the explicit and implicit design constraints, in the form of ground rules and user intent. A longest path algorithm is used to generate a scaling factor. The scaling factor is used to reduce the size of the circuit design to the minimum legal size. The scaling may be followed by application of minpert analysis to correct any errors introduced by the scaling. The resulting design is shrunk (or expanded) with all elements shrinking (or growing) together by the same factor, and with the relative relationships of elements maintained. In addition, the invention is operational in the presence of a positive cycle, can be run with scaling that freezes the sizes of any structure or ground rule, and can be applied to technology migration.

20 Claims, 3 Drawing Sheets

U.S. PATENT DOCUMENTS

| | | | |
|---|---|---|---|
| 6,044,208 | A | 3/2000 | Papadopoulou et al. |
| 6,099,584 | A | 8/2000 | Arnold et al. |
| 6,189,132 | B1 | 2/2001 | Heng et al. |
| 6,202,193 | B1 | 3/2001 | Emura et al. |
| 6,216,252 | B1 | 4/2001 | Dangelo et al. |
| 6,295,633 | B1 | 9/2001 | Murakawa |
| 6,378,114 | B1 | 4/2002 | Shenoy et al. |
| 6,412,097 | B1 | 6/2002 | Kikuchi et al. |
| 6,412,100 | B1 | 6/2002 | Sasagawa et al. |
| 6,434,721 | B1 | 8/2002 | Chiluvuri et al. |
| 6,507,931 | B1 | 1/2003 | Kotani et al. |
| 6,526,555 | B1 | 2/2003 | Teig et al. |
| 6,576,147 | B1 | 6/2003 | Mukai |
| 6,587,992 | B1 | 7/2003 | Marple |
| 6,874,133 | B1 * | 3/2005 | Gopalakrishnan et al. ...... 716/2 |
| 2005/0060672 | A1 * | 3/2005 | Poechmueller ................. 716/2 |

OTHER PUBLICATIONS

Chen, Z, et al. "A Fast Minimum Layout Perturbation Algorithm for Electromigration Reliability Enhancements", 1998 Proceedings of the International Symposium on Defect and Fault Tolerance in VLSI Systems, Nov. 2-4, 1998, pp. 56-63.*

"Flexible Image for Physical Layout of Circuits," A. R. Bruss et al., IBM Technical Disclosure Bulletin, vol. 27, No. 11, Apr. 1985, pp. 6687-6691.

"An Algorithm to Detect Positive Cycles in a Constraint Graph for Layout Compaction," K. Ishima et al., IEEE, CH2868-8/90/000-2853, 1990, pp. 2853-2856.

"Process Independent Constriant Graph Compaction," D. Boyer, 29th ACM/IEEE Design Automation Conference, Paper 21.4, pp. 318-322.

"An Algorithm to Compact a VLSI Symbolic Layout with Mixed Constraints," Y. Z. Liao et al., 20th Design Automation Conference, Paper 9.1, IEEE, 1983, pp. 107-112.

"Graph-Optimization Techniques for IC Layout and Compaction," G. Kedem et al., 20th Design Automation Conference, Paper 9.2, IEEE, 1983, pp. 113-120.

"Symbolic Layout Compaction Review," D. Boyer, 25th ACM/IEEE Design Automation Conference, Paper 26.1, 1988, pp. 383-389.

"A Subjective Review of Compaction," Y. Cho, 22nd Design Automation Conference, Paper 25.1, IEEE, 1985, pp. 396-404.

"An Introduction to VLSI Physical Design," M. Sarrafzadeh et al., Chapter 7, "Compaction," Section 7.1.2, "Graph-based Techniques," McGraw-Hill (1996), pp. 276-279.

"Algorithms for VLSI Physical Design Automation," 3rd Edition, N. Sherwani, Chapter 12, "Compaction," Section 12.3.1, "Constraint-Graph based Compaction," Kluwer Academic Publishers (1999), pp. 453-463.

* cited by examiner

CIRCUIT AREA MINIMIZATION USING SCALING

BACKGROUND OF INVENTION

1. Technical Field

The present invention relates generally to circuit design, and more particularly, to a method, system and program product for scaling and area minimization of a circuit design.

2. Related Art

Circuit compaction is an integral part of integrated circuit (IC) chip design methodology for design optimization or migration. In conventional circuit compaction, a circuit design is reduced to its minimum legal size by building a constraint graph that represents the shape edges as nodes, and ground rules and topological relationships as arcs. Each node value represents the edge's current position, and each arc value represents the minimum separation between the edges connected by the arc. In order to illustrate, FIG. 1 shows an illustrative circuit design 8 constraint graph. In a typical circuit compactor, reduction of circuit design 8 is completed by assigning a graph node 10a–d to represent a location of every shape edge 12 that is perpendicular to the direction of compaction (CD), and one graph node 10e–f each to a "source" 14 and a "sink" 16, which are the boundaries of the design. In the example shown in FIG. 1, two rectangles 18 are positioned side-by-side. Accordingly, if compaction occurs in an "X" direction, a graph node 10a–f would represent every vertical edge 12 of each rectangle 18. Each graph node 10a–f has a value (its X position).

In FIG. 1, the locations to be assigned are X1, X2, X3, X4 and sink 16. Source 14 is fixed at the origin. In addition, each graph node 10a–f has an arc 20a–f that connects it to its neighbors, which represent constraints (ground rule values) on the locations X1–X4 and sink 16. For example, arc 20a and 20e may be half the minimum spacing for wires on metal layer one (M1) and may be, for example, 0.1 microns (these arcs thus represent a boundary condition); arc 20c may be the minimum M1 spacing, e.g., 0.2 microns; and arcs 20b and 20d may be the minimum width for an M1 wire, e.g., 0.2 microns. Arc 20f will be ignored for now.

In order to compact the design to a minimum size, a graph longest path algorithm is used to find the minimum distance from the boundary to each node, subject to the restrictions represented by the arcs. That is, classical compaction will assign the locations X1, X2, X3, X4 and sink 16 using the "longest path" algorithm. The longest path algorithm will assign, for example:

| | | | |
|---|---|---|---|
| X1 | Source + 20a | 0 + 0.1 | 0.1 |
| X2 | X1 + 20b | 0.1 + 0.2 | 0.3 |
| X3 | X2 + 20c | 0.3 + 0.2 | 0.5 |
| X4 | X3 + 20d | 0.5 + 0.2 | 0.7 |
| Sink | X4 + 20e | 0.7 + 0.1 | 0.8 |

This configuration compacts rectangles 18 to their minimum legal size in the direction of compaction (CD).

One problem with conventional longest-path based compaction is that it is incapable of meeting all of the constraints which users place on the design. A completed circuit design is subject to constraints in the form of ground rules, which are well understood by conventional compaction. However, there are a number of other constraints that the designer has in mind while laying out the circuit. These constraints may relate to issues such as performance or yield objectives. Many of these constraints may not be able to be described geometrically, making them difficult to describe to a conventional compaction tool. For constraints that can be described, entering all of the user constraints into a compaction tool can be a task that is nearly as difficult as re-implementing the circuit from scratch.

Conventional longest path compaction algorithms cannot compact a design that contains a "positive cycle." A positive cycle typically results if there are illegal shape configurations (ground rule incorrect starting point), or if there are constraints that restrict the area of the layout to less than the required size. If there is a positive cycle, then there is no longest path. Removing the positive cycle in a typical compactor does not correct the illegality that brought about the cycle, e.g., a broken ground rule or unachievable constraint. Relative to FIG. 1, a positive cycle can be illustrated by assuming a boundary constraint that fixes arc 20f at 0.6. In this case, every time a conventional compactor traverses the path 20a, 20b, 20c, 20d, 20e, 20f, the total cost increases by 0.2 (i.e., 0.1+0.2+0.2+0.2+0.1−0.6). In a shortest path algorithm, the equivalent problem is referred to as a "negative cycle." In any case, the positive cycle represents a conflict in the constraints (arcs 20a–20f), not all of which can be met.

Another problem with classical compaction approaches is created by how the techniques create the maximum changes possible to the design. In particular, conventional compaction algorithms conduct "plowing" or squeezing of every shape as far as possible in the compaction direction, which can destroy symmetry or alignment that was present in the original design. For example, FIGS. 2A–2B illustrate two rows of elements in which the top row contains six (6) elements 30a–30f, and the bottom row contains only three (3) elements 32a–32c. In addition, every other top row element 30a, 30c, 30e is connected to one of the bottom row elements 30a, 30b, 30c, respectively. FIG. 2A illustrates an un-compacted layout, FIG. 2B illustrates a compacted layout using conventional compaction techniques including a "jog insertion" implementation such that wires can be bent as required. As illustrated in FIG. 2B, the layout is compacted in a legal manner, but the relative positions of elements 30a–30f and 32a–32c do not encompass the designer's original intent. This plowing of the layout prevents many designers from using a compactor because of the unpredictable and inelegant outcomes to the layout, which in turn prevents widespread use of compaction technology.

Minimum perturbation analysis (hereinafter referred to as "minpert") is used to implement ground rule adjustments in circuit designs in a way that makes the minimum number of changes necessary. In particular, when a design has a minpert analysis applied, any of the arcs 20a–20f (FIG. 1) that are legal, are frozen. Any arcs 20a–20f that are not legal are fed to a linear system solver, which attempts to fix every arc that does not have a currently legal value, and minimize the overall differences in positions, i.e., X2−X1>=0.2. If X2−X1 is currently 0.1, then the system will try to change X2−X1, while minimizing X2(new)−X2 (old), and minimizing X1(new)−X1(old). U.S. Pat. No. 6,189,132 to Heng et al., which is hereby incorporated by reference, discloses a design rule correction system and method that implements minpert analysis. Unfortunately, minpert analysis does not address area minimization.

Rudimentary scaling has been used to perform compaction, but has led to unacceptable results for widespread use.

In view of the foregoing, there is a need in the art for an improved compaction method, system and program product for compacting a circuit design.

SUMMARY OF INVENTION

The present invention provides a method, system and program product that implements area minimization of a circuit design while respecting the explicit and implicit design constraints, in the form of ground rules and user intent. A longest path algorithm is used to generate a scaling factor. The scaling factor is used to reduce the size of the circuit design to the minimum legal size. The scaling may be followed by application of minpert analysis to correct any errors introduced by the scaling. The resulting design is shrunk (or expanded) with all elements shrinking (or growing) together by the same factor, and with the relative relationships of elements maintained. In addition, the invention is operational in the presence of a positive cycle, can be run with scaling that freezes the sizes of any structure or ground rule, and can be applied to technology migration.

A first aspect of the invention is directed to a method for minimizing area of a circuit design, the method comprising the steps of: applying a longest path algorithm to the circuit design to determine a minimum legal size; calculating a scaling factor based on a ratio of the minimum legal size divided by a pre-compaction size; and scaling the circuit design using the scaling factor while maintaining an objective.

A second aspect of the invention is directed to a system for minimizing area of a circuit design, the system comprising the steps of: means for applying a longest path algorithm to the circuit design to determine a minimum legal size; means for calculating a scaling factor based on a ratio of the minimum legal size divided by a pre-compaction size; and means for scaling the circuit design using the scaling factor while maintaining an objective.

A third aspect of the invention is directed to a computer program product comprising a computer useable medium having computer readable program code embodied therein for minimizing area of a circuit design, the program product comprising: program code configured to apply a longest path algorithm to the circuit design to determine a minimum legal size from a boundary to an opposite boundary; program code configured to calculate a scaling factor based on a ratio of the minimum legal size divided by a pre-compaction size from the boundary to the opposite boundary; program code configured to scale the circuit design using the scaling factor; and program code configured to apply a minimum perturbation analysis to the scaled circuit design.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 1:
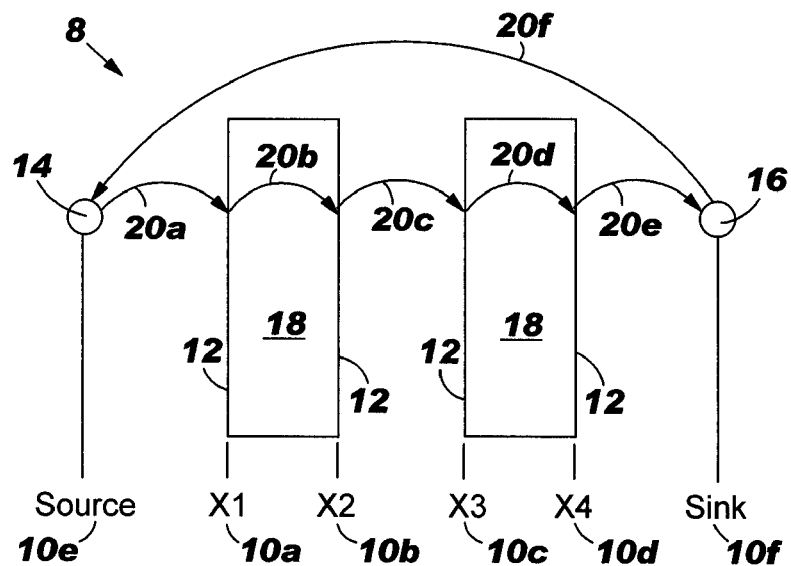
FIG. 1 shows an illustrative prior art constraint graph for use with a prior art compaction algorithm.
Figure 2A:
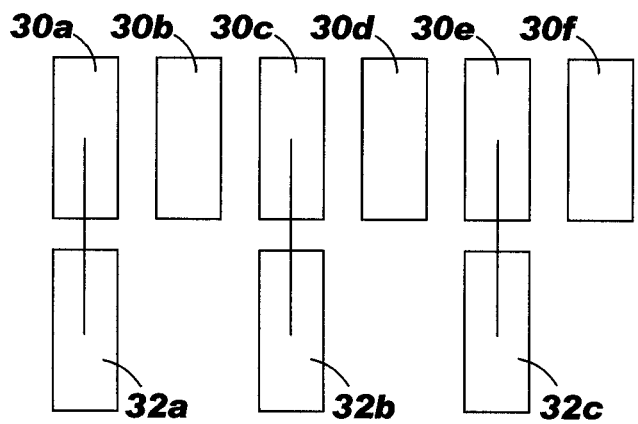
FIG. 2A shows another illustrative circuit design.
Figure 2B:
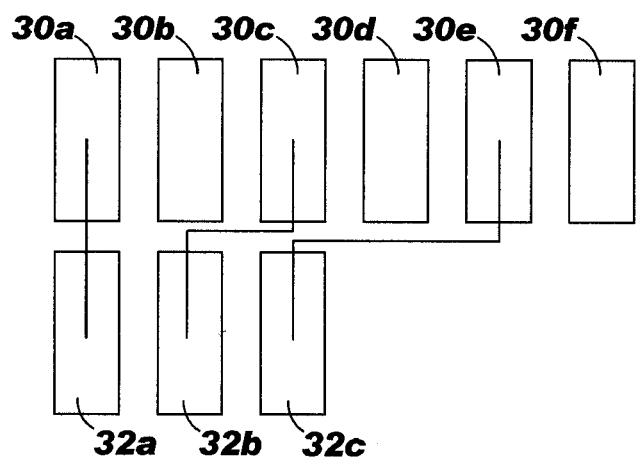
FIG. 2B shows application of a prior art compaction algorithm to the illustrative circuit design of FIG. 2A.
Figure 3:
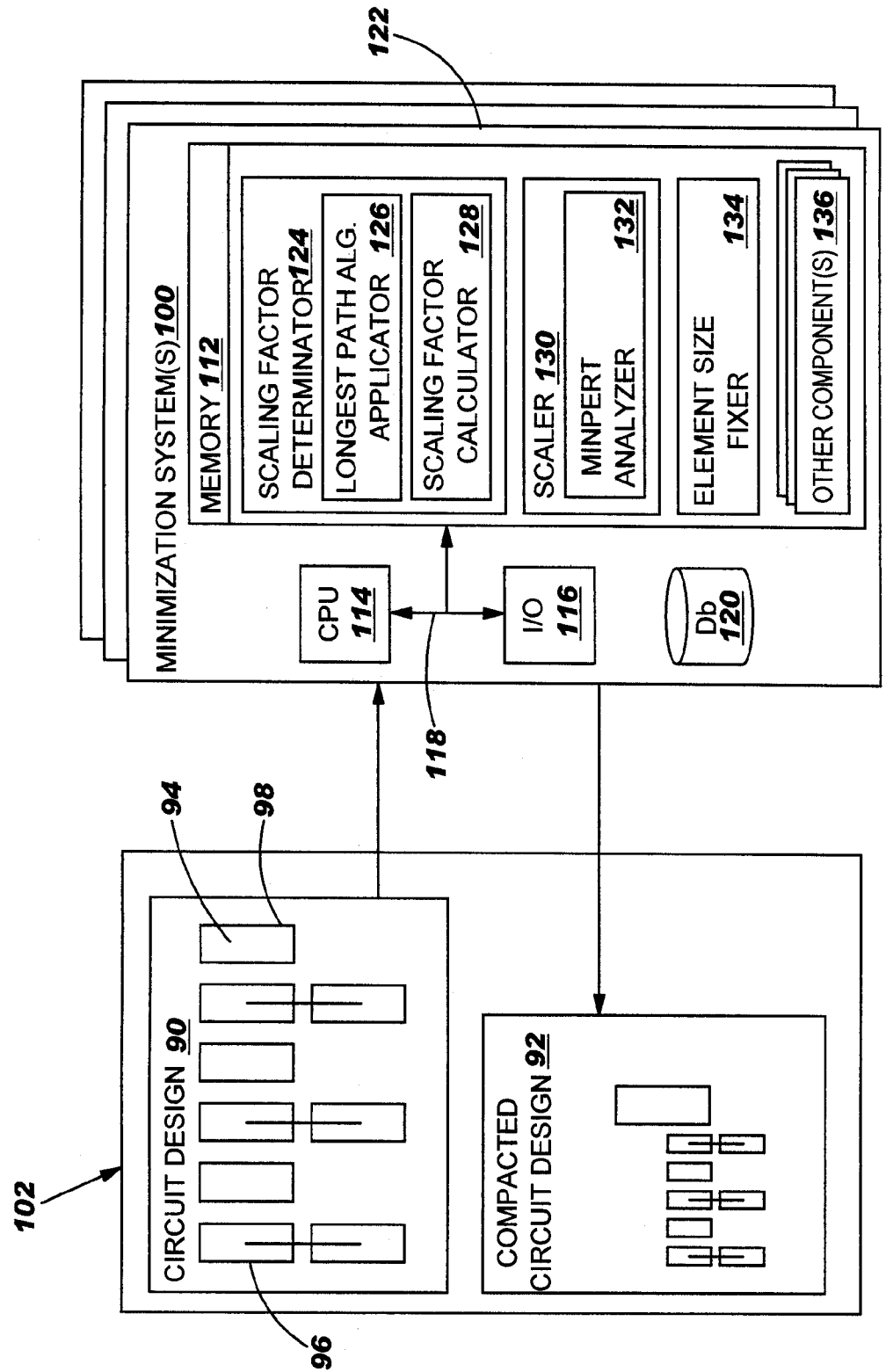
FIG. 3 shows a block diagram of a minimization system according to the invention.

With reference to the accompanying drawings, FIG. 3 is a block diagram of a circuit design area minimization system 100 (hereinafter "minimization system") in accordance with the invention. Minimization system 100 includes a memory 112, a central processing unit (CPU) 114, input/output devices (I/O) 116 and a bus 118. A database 120 may also be provided for storage of data relative to processing tasks. Memory 112 includes a program product 122 that, when executed by CPU 114, comprises various functional capabilities described in further detail below. Memory 112 (and database 120) may comprise any known type of data storage system and/or transmission media, including magnetic media, optical media, random access memory (RAM), read only memory (ROM), a data object, etc. Moreover, memory 112 (and database 120) may reside at a single physical location comprising one or more types of data storage, or be distributed across a plurality of physical systems. CPU 114 may likewise comprise a single processing unit, or a plurality of processing units distributed across one or more locations. I/O 116 may comprise any known type of input/output device including a network system, modem, keyboard, mouse, scanner, voice recognition system, CRT, printer, disc drives, etc. Additional components, such as cache memory, communication systems, system software, etc., may also be incorporated into system 100.

As shown in FIG. 3, minimization system 100 may interact or be configured to operate as part of a larger circuit design system 102. Design system 102 provides a circuit design 90 to be compacted, and receives a compacted circuit design 92. Program product 122 may include a scaling factor determinator 124 including a longest path algorithm applicator 126 and a scaling factor calculator 128; a scaler 130 including a minimum perturbation analyzer 132; and an element size fixer 134 and other system components 136. Other system components 136 may include any other hardware or software necessary to achieve minimization system 100 functioning not distinctly described herein.

Figure 4:
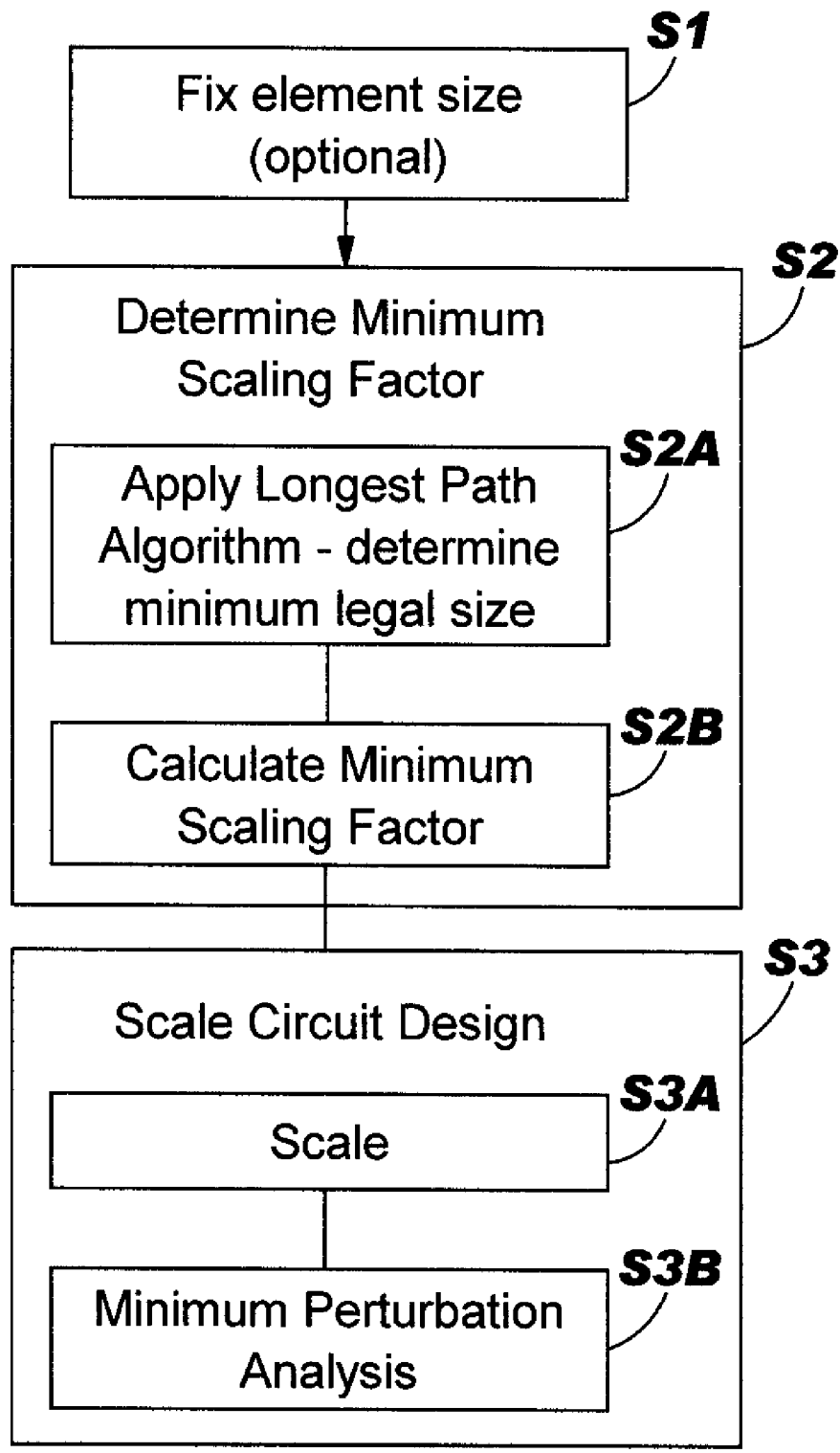
FIG. 4 shows a flow diagram of operation methodology of the minimization system of FIG. 3.

Turning to FIG. 4, in conjunction with FIG. 3, operation methodology for minimization system 100 will now be described. As an alternative precursor step S1, element size fixer 136 may be implemented to denote one or more elements 94 of circuit design 90 to be fixed in size. For example, size of a gate or other device, or a wire may be fixed prior to a longest path algorithm applying step and a scaling step, as will be described below. In one particular embodiment, a gate in circuit design 90 is fixed in size.

In a first step S2, a scaling factor is determined by scaling factor determinator 124. In one embodiment, step S2 includes, at step S2A, applicator 126 applying a longest path algorithm to circuit design 90 having a pre-compaction size (Z1) to determine a minimum legal size (denoted Z2) from a boundary (i.e., source) 96 to an opposite boundary (i.e., sink) 98. Since various longest path algorithms are well known in the industry, details of their operability will not be provided. Generally, however, positions are assigned to the vertices that minimize the distance from source 96 to sink 98, as shown in FIG. 3, which minimizes the design width in a direction of compaction. In one embodiment, the longest path algorithm is applied with assigning of a source 96 and a sink 98 only. In addition, where the longest path algorithm cannot be completed due to a "positive cycle," applicator 124 ignores or makes an assumption regarding selected design constraints, i.e., backward arcs.

A "positive cycle" is a design rule constraint or error, which prevents a classic longest path algorithm from finding a longest path through the circuit. A positive cycle typically results if there are illegal shape configurations (e.g., ground rule incorrect starting point), or if there are constraints that restrict the area of circuit design 90 to less than the required size. If there is a positive cycle, then the longest path will not exist. Scaling factor determinator 124 identifies the constraints that cause the positive cycle, and proceed with an approximate solution. Alternatively, the invention may detect the positive cycle, remove one or more constraints that create the cycle, and determine a new minimum legal size. This new minimum 'legal' size will be smaller than the actual legal minimum for the circuit. However, the minimum perturbation analysis, as will be described below, will correct for these illegalities. Accordingly, the invention is not sensitive to the positive cycle phenomenon.

Returning to FIG. 4, in step S2B, a scaling factor is calculated by calculator 128 based on a ratio of minimum legal size (Z2) divided by pre-compaction size (Z1) from boundary 96 to opposite boundary 98. In calculating a scaling factor using this step, the present invention eliminates the hit-or-miss approximations of conventional scaling systems.

In step S3, circuit design 90 is scaled. In particular, at step S3A, circuit design 90 is scaled by scaler 130 using scaling factor (Z2/Z1). As used herein, "scaling" means taking circuit design 90 and multiplying the coordinates of every vertex by scaling factor (Z2/Z1). For example, an 80% scaling would involve multiplying every vertex's X and Y coordinates by 0.80, which has the effect of shrinking or expanding the design uniformly. As noted above, element(s) 94 sizes may be fixed as needed (optionally not scale actual devices or wires). In addition, scaler 130 can also scale elements (e.g., gates, other devices, wires, etc.) as a group or individually, thus re-sizing devices on-the-fly. Scaler 130 can also run various methods of scaling wires.

The above-described scaling may result in some illegalities. Accordingly, in step S3B, as an alternative step, a minimum perturbation (minpert) analysis may be conducted on compacted circuit design 92 by minpert analyzer 132. This step corrects any ground rule error(s) in compacted circuit design 92 by making the minimum number of changes necessary. Implementation of minpert analysis may be similar to that disclosed in U.S. Pat. No. 6,189,132 to Heng et al. Since the original scaling factor (Z2/Z1) was legal, the boundary of compacted circuit design 92 should not grow during this step.

As shown in compacted circuit design 94 (FIG. 3), the above-described invention can compact a circuit design 90 while maintaining objectives such as: a distance between elements, alignment of elements, a size of an element, relative positions of elements, and overall pattern of the un-compacted circuit design. The design is not "plowed" in one direction or the other, which previously may have prevented designers from using a compactor because of the unpredictable and inelegant outcomes to the layout. Accordingly, the invention generates a compacted circuit design that looks like the original, but is smaller. Another advantage of the present invention is that it can be applied to migration.

In the previous discussion, it will be understood that the method steps discussed are performed by a processor, such as CPU 114 of system 100, executing instructions of program product 122 stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

The invention claimed is:

1. A method for minimizing area of a circuit design, the method comprising the steps of:
    applying a longest path algorithm to the circuit design to determine a minimum legal size;
    calculating a scaling factor based on a ratio of the minimum legal size divided by a pre-compaction size; and
    scaling the circuit design using the scaling factor while maintaining an objective.

2. The method of claim 1, wherein the minimum legal size and the pre-compaction size are measured from a boundary to an opposite boundary.

3. The method of claim 1, further comprising the step of fixing an element size prior to the longest path algorithm applying step and the scaling step.

4. The method of claim 1, wherein the longest path algorithm applying step includes assigning of a sink and a source only.

5. The method of claim 1, wherein the longest path algorithm applying step includes ignoring selected design constraints in the case that the longest path algorithm cannot be completed due to a design rule constraint.

6. The method of claim 1, further comprising the step of fixing an element size prior to the scaling step such that the element size does not change during the scaling step.

7. The method of claim 6, wherein the element includes one of a device and a wire.

8. The method of claim 1, wherein the step of maintaining includes applying a minimum perturbation analysis to the scaled circuit design to correct a ground rule error in the scaled circuit design.

9. The method of claim 1, wherein the objective includes at least one of: a distance between elements, alignment of elements, a size of an element, relative positions of elements, and an overall pattern of an un-compacted circuit design.

10. A system for minimizing area of a circuit design, the system comprising the steps of:
   means for applying a longest path algorithm to the circuit design to determine a minimum legal size;
   means for calculating a scaling factor based on a ratio of the minimum legal size divided by a pre-compaction size; and
   means for scaling the circuit design using the scaling factor while maintaining an objective.

11. The system of claim 10, wherein the minimum legal size and the pre-compaction size are measured from a boundary to an opposite boundary.

12. The system of claim 10, wherein the longest path algorithm applying means ignores selected design constraints in the case that the longest path algorithm cannot be completed due to a design rule constraint.

13. The system of claim 10, wherein the scaling means further includes means for conducting a minimum perturbation analysis to the scaled circuit design.

14. The system of claim 10, further comprising means for fixing a size of an element in the circuit design prior to scaling such that the element size does not change during scaling.

15. A computer program product comprising a computer useable medium having computer readable program code embodied therein for minimizing area of a circuit design, the program product comprising:
   program code configured to apply a longest path algorithm to the circuit design to determine a minimum legal size from a boundary to an opposite boundary;
   program code configured to calculate a scaling factor based on a ratio of the minimum legal size divided by a pre-compaction size from the boundary to the opposite boundary;
   program code configured to scale the circuit design using the scaling factor; and
   program code configured to apply a minimum perturbation analysis to the scaled circuit design.

16. The program product of claim 15, wherein the longest path algorithm applying program code applies the algorithm with assigning of a sink and a source only.

17. The program product of claim 15, wherein the longest path algorithm applying program code ignores selected design constraints in the case that the longest path algorithm cannot be completed due to a design rule constraint.

18. The program product of claim 15, wherein the scaling program code fixes a size of an element in the circuit design prior to scaling such that the element size does not change during scaling.

19. The program product of claim 15, wherein the longest path algorithm applying program code fixes a size of a gate in the circuit design prior to applying the longest path algorithm, wherein the scaling program code maintains the fixed size during scaling.

20. The program product of claim 15, wherein the minimum perturbation analysis applying program code corrects a ground rule error in the scaled circuit design.

* * * * *